United States Patent [19]
Fujiwara

[11] Patent Number: 5,442,308
[45] Date of Patent: Aug. 15, 1995

[54] DYNAMIC DECODER CIRCUIT OPERATIVE AT LOW FREQUENCY CLOCK SIGNALS WITHOUT DATA DESTRUCTION

[75] Inventor: Hisashi Fujiwara, Tokyo, Japan

[73] Assignee: NEC Corporation, Tokyo, Japan

[21] Appl. No.: 190,477

[22] Filed: Feb. 2, 1994

[30] Foreign Application Priority Data

Feb. 4, 1993 [JP] Japan .................... 5-017155

[51] Int. Cl.⁶ .......................... H03K 19/0948
[52] U.S. Cl. .......................... 326/108; 326/97
[58] Field of Search ............ 307/463, 480, 481, 443, 307/452, 449; 326/108, 97

[56] References Cited

U.S. PATENT DOCUMENTS

| | | | |
|---|---|---|---|
| 4,620,116 | 10/1986 | Ozawa | 307/463 |
| 4,668,880 | 5/1987 | Shoji | 307/481 |
| 4,769,562 | 9/1988 | Ghisio | 307/481 |
| 4,827,160 | 5/1989 | Okano | 307/481 |
| 5,250,857 | 10/1993 | Miyazaki | 307/463 |

*Primary Examiner*—David R. Hudspeth
*Assistant Examiner*—Benjamin D. Driscoll
*Attorney, Agent, or Firm*—Sughrue, Mion, Zinn, Macpeak & Seas

[57] ABSTRACT

A dynamic decoder stores decoded signals in latch circuits for producing output signals, and the latch circuits are disabled after storing the decoded signals so that the output signals are free from undesirable level change of the decoded signals due to leakage between the dynamic decoding operations.

7 Claims, 5 Drawing Sheets

DYNAMIC DECODER CIRCUIT OPERATIVE AT LOW FREQUENCY CLOCK SIGNALS WITHOUT DATA DESTRUCTION

FIELD OF THE INVENTION

This invention relates to a dynamic decoder circuit and, more particularly, to a dynamic decoder circuit at low frequency clock signals without data destruction.

DESCRIPTION OF THE RELATED ART

Decoders are broken down into a static type and a dynamic type, and are incorporated in memory devices and data processors. A decoder in the memory device such as a read-only memory or a random access memory is available for an address selection, and is responsive to an n-bit address signal for selectively energizing $2^n$ signal lines. A typical example of the decoder in the data processor is an instruction decoder, and the instruction decoder produces control signals from an instruction code.

The static type address decoder is usually implemented by NAND gates and NOR gates, and a large number of complementary inverters form the NAND and NOR gates of the static type address decoder. The memory device is progressively increasing the memory capacity, and, accordingly, the increased addressable memory cells require a large address decoder. This means that the static type address decoder occupies a substantial amount of real estate, and a small-sized decoder is necessary for an ultra large scale integrated memory device.

The dynamic type decoder is fabricated from a smaller number of transistors than the static type decoder, and is desirable for the ultra large scale integrated memory device. FIG. 1 illustrates a typical example of the dynamic type decoder, and largely comprises a synchronous circuit 1, an array of n-channel enhancement type switching transistors Qn11 to Qn14, Qn21 to Qn24, Qn31 to Qn34 and Qnn1 to Qnn4, a discharging circuit 2, a precharging circuit 3 and an array of latch circuits 11 to 1n.

A clock signal CL1 is supplied directly to the synchronous circuit 1 and through an inverter IV1 to the discharging circuit 2 and to the precharging circuit 3, and the discharging circuit 2 and the precharging circuit 3 alternately connect the columns of the n-channel enhancement type switching transistors Qn11 to Qn14, Qn21 to Qn24, Qn31 to Qn34 and Qnn1 to Qnn4 with a positive power voltage line Vdd and with a ground voltage line.

The discharging circuit 2 is implemented by a row of n-channel enhancement type discharging transistors Qn51 to Qn5n, and the row of n-channel enhancement type discharging transistors Qn51 to Qn5n is coupled between the columns of the n-channel enhancement type switching transistors Qn11 to Qn14, Qn21 to Qn24, Qn31 to Qn34 and Qnn1 to Qnn4 and the ground voltage line. The inverter IV1 supplies the complementary signal CCL1 to the gate electrodes of the n-channel enhancement type discharging transistors Qn51 to Qn5n, and the n-channel enhancement type discharging transistors Qn51 to Qn5n concurrently turn on and off depending upon the voltage level of the complementary signal CCL1.

On the other hand, the precharging circuit 3 is implemented by a row of p-channel enhancement type charging transistors Qp61 to Qp6n, and the row of p-channel enhancement type charging transistors Qp61 to Qp6n is coupled between the positive power voltage line Vdd and the columns of the n-channel enhancement type switching transistors Qn11 to Qn14, Qn21 to Qn24, Qn31 to Qn34 and Qnn1 to Qnn4. The inverter IV1 supplies the complementary signal CCL1 to the gate electrodes of the p-channel enhancement type charging transistors Qp61 to Qp6n, and the p-channel enhancement type charging transistors Qp61 to Qp6n concurrently turn on and off complementarily to the n-channel enhancement type discharging transistors Qn51 to Qn5n.

The p-channel enhancement type charging transistors Qp61 to Qp6n charge drain nodes thereof to the positive high voltage level before the synchronous circuit 1 supplies input signals I1 to I6 to the array of n-channel enhancement type switching transistors Qn11 to Qnn4, and the n-channel enhancement type discharging transistors Qn51 to Qn5n allow the array of n-channel enhancement type switching transistors Qn11 to Qnn4 to produce decoded signals at the drain nodes of the p-channel enhancement type charging transistors Qp61 to Qp6n.

The latch circuits 11 to 1n are respectively associated with the columns of the n-channel enhancement type switching transistors Qn11 to Qn14, Qn21 to Qn24, Qn31 to Qn34 and Qnn1 to Qnn4, and are identical in circuit arrangement to one another. For this reason, only the latch circuit 11 is described hereinbelow.

The latch circuit comprises an input clocked inverter IV2, a memory loop consisting of an inverter IV3 and a clocked inverter IV4, and an output inverter IV5, and a delayed clock signal DCL2 and a complementary clock signal CCL2 are supplied to the control nodes of the clocked input inverters IV2 and the clocked inverters IV4, respectively. The input nodes of the clocked input inverters IV2 are coupled with the drain nodes of the p-channel enhancement type charging transistors Qp61 to Qp6n. A clock signal CL2 is supplied to a series of inverters IV6 and IV7, and the inverters IV6 and IV7 respectively produce the complementary clock signal CCL2 and the delayed clock signal DCL2. The clock signal CL2 is 180 degrees different in phase from the clock signal CL1.

The delayed clock signal DCL2 of active "1" level enables the clocked input inverters IV2 so as to pass the decoded signals, and the complementary clock signal CCL2 allows the memory loops to store the decoded signals.

The circuit behavior of the prior art dynamic decoder is described on the assumption that the input signals I1 to I6 are logic "1" level, logic "0" level, logic "1" level, logic "1" level, logic "1" level and logic "0" level. The logic "1" level and the logic "0" level are assumed to be equivalent to a high voltage level and a low voltage level, respectively.

If the clock signal CL1 rises toward the high voltage level at time t1, the synchronous circuit 1 latches the input signals I1 to I6, and the complementary clock signal CCL1 of the low voltage level allows the p-channel enhancement type charging transistors Qp61 to Qp6n to turn on for charging the drain nodes to the high voltage level.

The synchronous circuit 1 selectively supplies the synchronous input signals G1 to G6 to the array of n-channel enhancement type switching transistors Qn11 to Qnn4, and the n-channel enhancement type switching transistors Qn11 o Qnn4 selectively turn on.

Namely, the synchronous input signals G1, G3, G4 and G5 of the high voltage level allow the n-channel enhancement type switching transistors Qn11, Qn12/ Qn22, Qn13/ Qn32 and Qn14/ Qn23/ Qn33 to turn on, and the synchronous input signals G2 and G6 of the low voltage level keep the n-channel enhancement type switching transistors Qn21/ Qn31 and Qn24/ Qn34 off. As a result, only the column of n-channel enhancement type switching transistors Qn11 to Qn14 provides a current path from the precharging circuit 3 to the discharging circuit 2. However, each of the other columns have at least one turned-off switching transistor, and any current path is not established.

The clock signal CL1 goes down to the low voltage level at time t2, and the complementary signal CCL1 allows the n-channel enhancement type discharging transistors Qn51 to Qn5$n$ to turn on. However, the complementary signal CCL1 causes the p-channel enhancement type charging transistors Qp61 to Qp6$n$ to turn off.

The column of n-channel enhancement type switching transistors Qn11 to Qn14 has already provided the current path from the drain nodes of the p-channel enhancement type switching transistors Qp61 to Qp6$n$ to the discharging circuit 2, and the n-channel enhancement type discharging transistor Qn51 discharges the drain node of the p-channel enhancement type switching transistor Qp61. However, the other columns keep the drain nodes of the p-channel enhancement type switching transistors Qp62 to Qp6$n$ at the high voltage level. As a result, the decoded signal D1 of logic "0" level and the decoded signals D2 to Dn of logic "1" level are produced at the drain node of the p-channel enhancement type charging transistors Qp61 to Qp6$n$.

The complementary clock signal CCL2 of logic "0" level disables the clocked inverters IV4 at time t2, and the memory loops of the latch circuits 11 to I$n$ become ready for memorization of the decoded signals D1 to Dn.

The delayed clock signal DCL2 rises toward the high voltage level at time t3, and the clocked input inverters IV2 are enabled. As a result, the decoded signals D1 to Dn are inverted by the clocked input inverters IV2, and the complementary decoded signals reach the respective memory loops. The complementary decoded signals are twice inverted by the inverters IV3 and IV5, and are supplied from the inverters IV5 as output signals O1 to On.

The clock signal CL2 goes down to the low voltage level at time t4, and, accordingly, the complementary clock signal CCL2 goes up to the active high voltage level. Then, the clocked inverters IV4 are enabled, and the complementary decoded signals are stored in the respective memory loops.

The prior art dynamic decoder thus arranged encounters a problem in that undesirably inverted decoded signal is latched by the associated latch circuit. In detail, while the prior art dynamic decoder is operating on the input signals I1 to I6 in synchronism with high frequency clock signals CL1 and CL2, the malfunction is less liable to take place. However, if low-frequency clock signals CL1 and CL2 are supplied to the prior art dynamic decoder, output signals are much liable to be undesirably inverted.

SUMMARY OF THE INVENTION

It is therefore an important object of the present invention to provide a dynamic decoder which is operative at both high and low frequency clock signals without the malfunction.

The present inventor contemplated the problem, and concluded that electric charges accumulated in the drain nodes of the p-channel enhancement type charging transistors leaked out.

To accomplish the object, the present invention proposes to disable latch circuits after decoded signals are stored.

In accordance with the present invention, there is provided a dynamic decoder for decoding input signals, comprising: a) a main precharging circuit coupled with decoded signal nodes for charging to a first level at a first timing; b) a main discharging circuit associated with the decoded signal nodes for discharging the decoded signal nodes at a second timing after the first timing; c) a plurality of switching transistors disposed at selected positions in a matrix, and grouped into a plurality of serial circuits coupled between the decoded signal nodes and the main discharging circuit; d) an input circuit operative to selectively supply the input signals to control nodes of the plurality of switching transistors between the first timing and the second timing for selectively discharging the decoded signal nodes through the main discharging circuit, a plurality of decoded signals being produced at the decoded signal nodes at a third timing after the second timing; e) a plurality of latch circuits respectively coupled with the decoded signal nodes, and enabled with an enable signal for latching the plurality of decoded signals, the enable signal being shifted to an inactive level at a fourth timing for electrically isolating the plurality of latch circuits from the decoded signal nodes; f) a timing producing means for producing a timing control signal after a predetermined lapse of time from the second timing; and g) a controlling circuit responsive to the timing control signal for shifting the enable signal to the inactive level at the fourth timing.

BRIEF DESCRIPTION OF THE DRAWINGS

The features and advantages of the dynamic decoder according to the present invention will be more clearly understood from the following description taken in conjunction with the accompanying drawings in which.

DESCRIPTION OF THE PREFERRED EMBODIMENTS

First Embodiment

Figure 1:
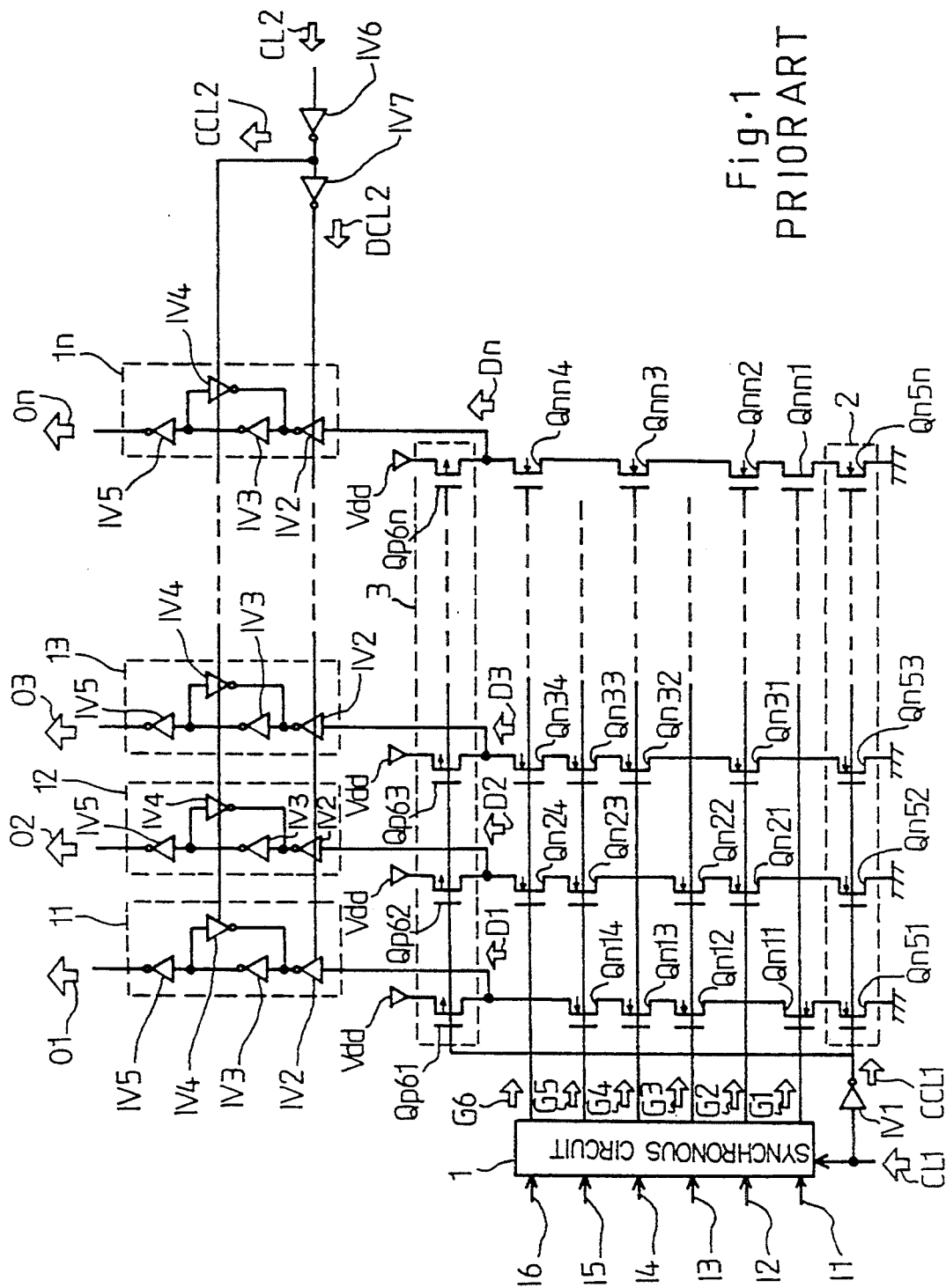
FIG. 1 is a circuit diagram showing the arrangement of the prior art dynamic decoder.
Figure 2:
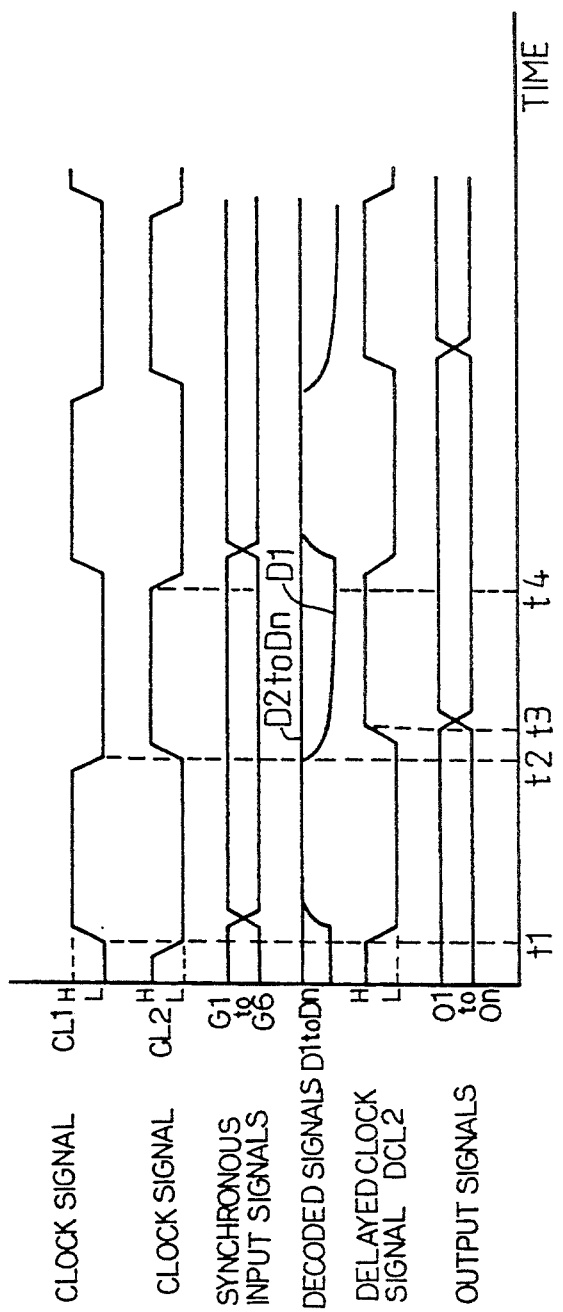
FIG. 2 is a time chart showing the decoding sequence of the prior art dynamic decoder.
Figure 3:
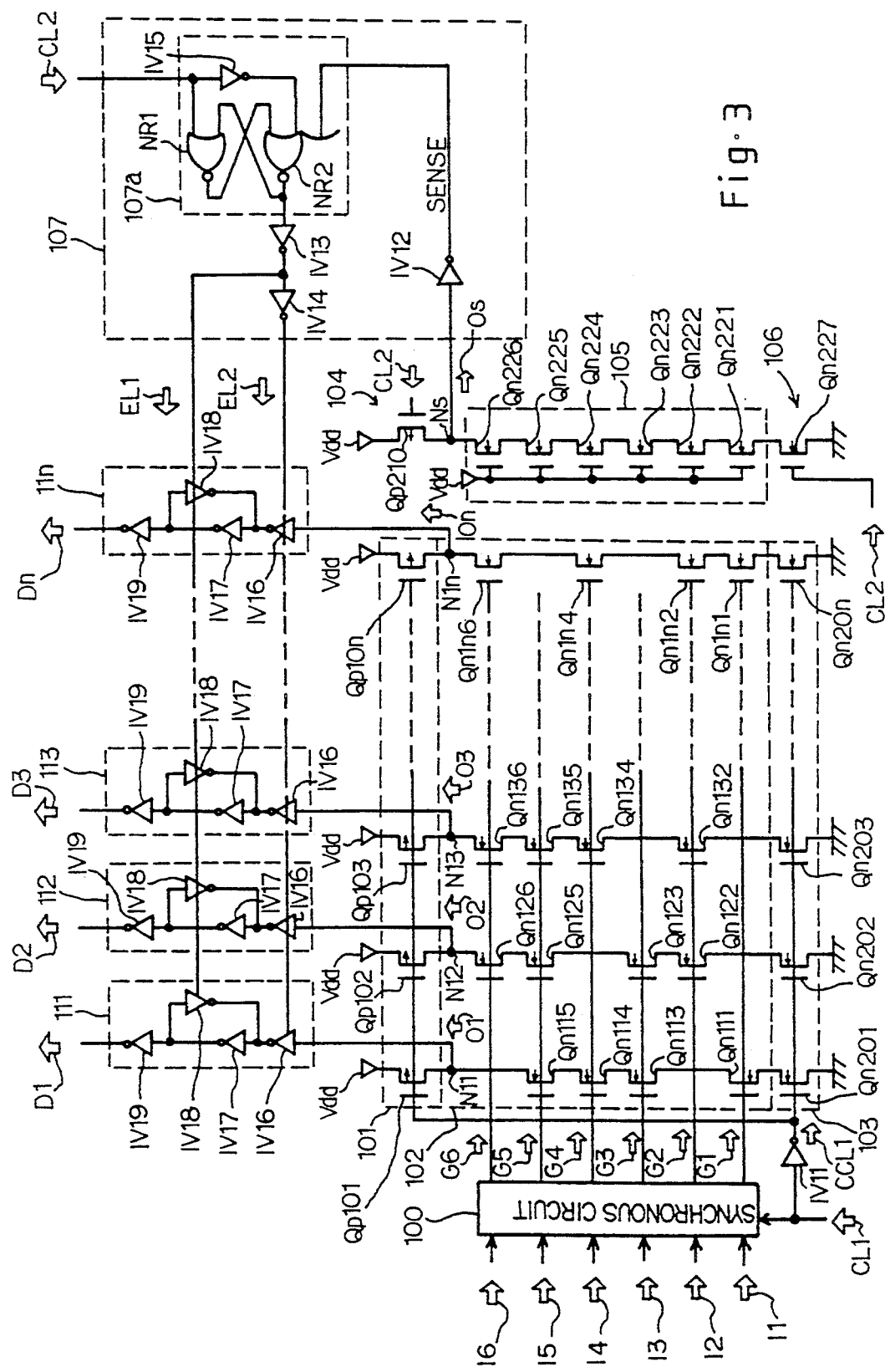
FIG. 3 is a circuit diagram showing the circuit arrangement of a dynamic decoder according to the present invention.

Referring to FIG. 3 of the drawings, a dynamic decoder embodying the present invention largely comprises a synchronous circuit 100, a main precharging circuit 101, a switching transistor array 102, a main discharging circuit 103, an auxiliary precharging circuit 104, a timer circuit 105, an auxiliary discharging circuit 106, a controlling circuit 107 and an array of latch circuits 111, 112, 113 and 11n. A first clock signal CL1 and a second clock signal CL2 are supplied to the dynamic decoder shown in FIG. 3. The leading edge of the first clock signal CL1 is slightly delayed from the trailing edge of the second clock signal CL2. However, the first and second clock signals CL1 and CL2 are substantially complementary to one another. In this instance, the auxiliary precharging circuit 104, the timer circuit 105 and the auxiliary discharging circuit 106 as a whole constitute a timing producing means.

Input signals I1 to I6 are supplied to the synchronous circuit 100, and the synchronous circuit 100 is responsive to the first clock signal CL1 for supplying synchronized input signals G1 to G6 to the switching transistor array 102.

The precharging circuit 101 is implemented by a row of p-channel enhancement type charging transistors Qp101, Qp102, Qp103 and Qp10n, and a positive power voltage line Vdd is coupled with the source nodes of the p-channel enhancement type charging transistors Qp101 to Qp10n. An inverter IV11 produces a complementary clock signal CCL1 from the first clock signal CL1, and the complementary clock signal CCL1 is supplied to the gate electrodes of the p-channel enhancement type charging transistors Qp101 to Qp10n.

The switching transistor array 102 is implemented by a plurality of n-channel enhancement type switching transistors Qn111/ Qn113/ Qn114/ Qn115, Qn122/ Qn123/ Qn125/ Qn126, Qn132/ Qn134/ Qn135/ Qn136, . . . and Qn1n1/ Qn1n2/ Qn1n4/ Qn1n6 arranged in six rows and n columns, and the n-channel enhancement type switching transistors Qn111 to Qn1n6 are disposed at selected points in a matrix. For example, in the leftmost column, the n-channel enhancement type switching transistors Qn111, Qn113, Qn114 and Qn115 are disposed at the crossing points of the first, third, fourth and fifth rows; however, any n-channel enhancement type switching transistor is not provided for the second and sixth rows. The synchronized input signals I1 to I6 are assigned to the first to sixth rows, and are supplied to the gate electrodes of the associated n-channel enhancement type switching transistors. The columns of n-channel enhancement type switching transistors Qn111 to Qn1n6 are coupled in series, and current is supplied from the p-channel enhancement type charging transistors Qp101 to Qp10n to the associated columns of n-channel enhancement type switching transistors Qn111 to Qn1n6.

The discharging circuit is implemented by a row of n-channel enhancement type discharging transistors Qn201, Qn202, Qn203 and Qn20n, and the n-channel enhancement type discharging transistors Qn201 to Qn20n are respectively coupled between the columns of n-channel enhancement type switching transistors Qn111 to Qn1n6 and a ground voltage line. The complementary clock signal CCL1 is supplied to the gate electrodes of the n-channel enhancement type discharging transistors Qn201 to Qn20n, and causes the p-channel enhancement type charging transistors Qp101 to Qp10n and the n-channel enhancement type discharging transistors Qn201 to Qn20n to complementarily turn on and off.

The auxiliary precharging circuit is implemented by a p-channel enhancement type charging transistor Qp210, and the p-channel enhancement type charging transistor Qp210 is coupled between the positive power voltage line Vdd and the timer circuit 105. The second clock signal CL2 is supplied to the p-channel enhancement type charging transistor Qp210, and current is supplied from the p-channel enhancement type charging transistor Qp210 to the timer circuit 105.

The timer circuit 105 is implemented by a column of n-channel enhancement type load transistors Qn221, Qn222, Qn223, Qn224, Qn225 and Qn226, the n-channel enhancement type load transistors Qn221 to Qn226 are coupled in series between the auxiliary precharging circuit 104 and the auxiliary discharging transistor 106. The positive power voltage level Vdd is supplied to the gate electrodes of the n-channel enhancement type load transistors Qn221 to Qn226, and the n-channel enhancement type load transistors Qn221 to Qn226 are turned on at all times.

The auxiliary discharging circuit 106 is implemented by an n-channel enhancement type discharging transistor Qn227 coupled between the timer circuit 105 and the ground voltage line, and the second clock signal CL2 is supplied the gate electrode of the n-channel enhancement type discharging transistor Qn227. The second clock signal CL2 causes the p-channel enhancement type charging transistor Qp210 and the n-channel enhancement type discharging transistor Qn227 to complementarily turn on and off, and the switching action of the p-channel enhancement type charging transistor Qp210 and the n-channel enhancement type discharging transistor Qn227 are corresponding to the p-channel enhancement type charging transistors Qp101 to Qp10n and the n-channel enhancement type discharging transistors Qn201 to Qn20n, respectively.

The controlling circuit 107 comprises a D-flip flop circuit 107a and three inverters IV12, IV13 and IV14, and two NOR gates NR1 and NR2 and an inverter IV15 form the D-flip flop circuit 107a. The inverter IV12 is coupled with a reset node of the D-flip flop circuit 107a, and the inverters IV13 and IV14 produce first and second enable signals EL1 and EL2, respectively.

The latch circuits 111 to 11n are similar in circuit arrangement to one another, and each of the latch circuits 111 to 11n comprises an clocked input inverter IV16, A memory loop implemented by an inverter IV17 and a clocked inverter IV18 and an output inverter IV19. The clocked input inverters IV16 and the clocked inverters IV18 are respectively enabled with the second enable signal EL2 and the first enable signal EL1, and the first and second enable signals EL1 and EL2 are active in the high voltage level.

Figure 4:
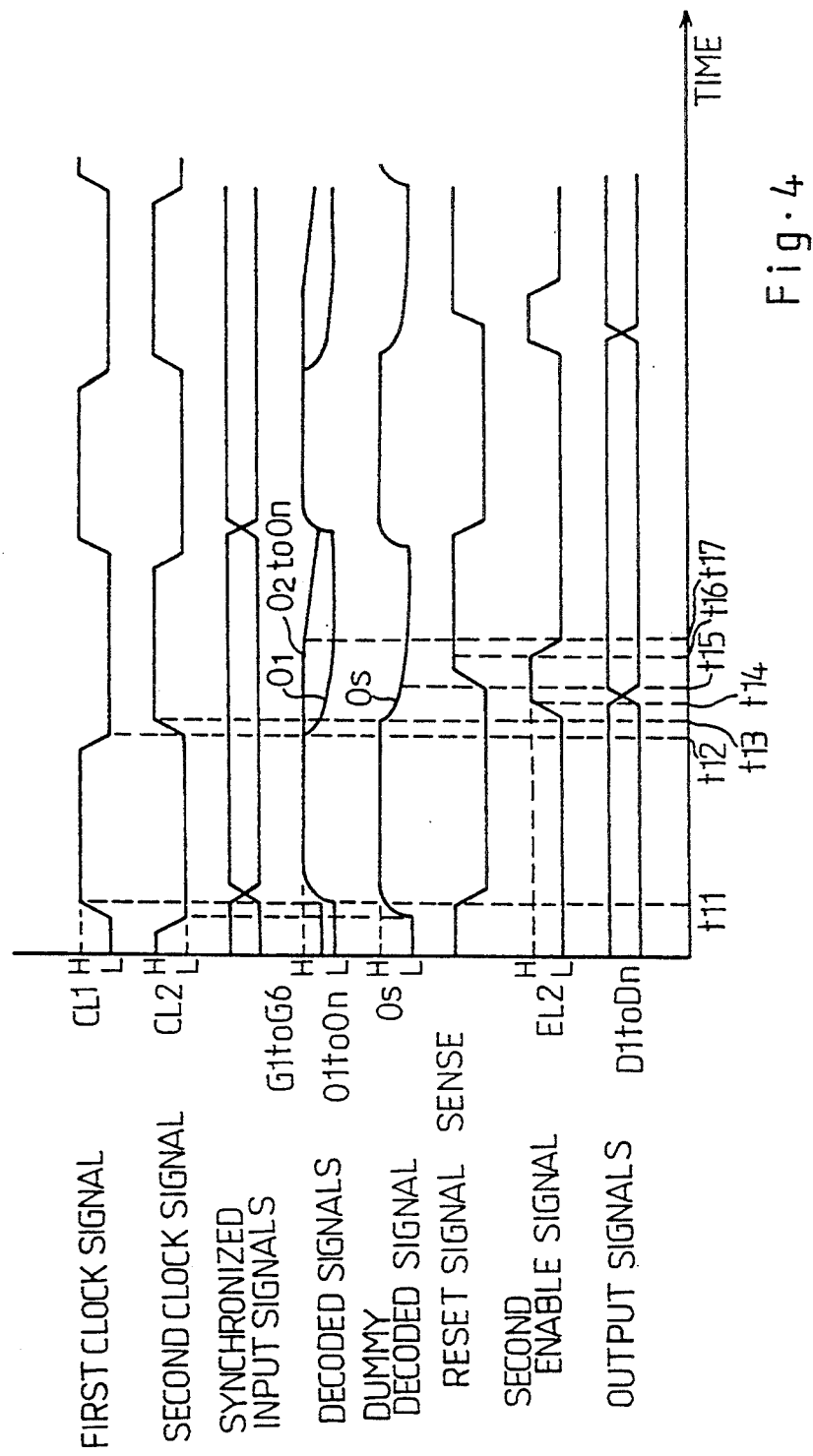
FIG. 4 is a time chart showing the decoding sequence of the dynamic decoder according to the present invention.
Figure 5:
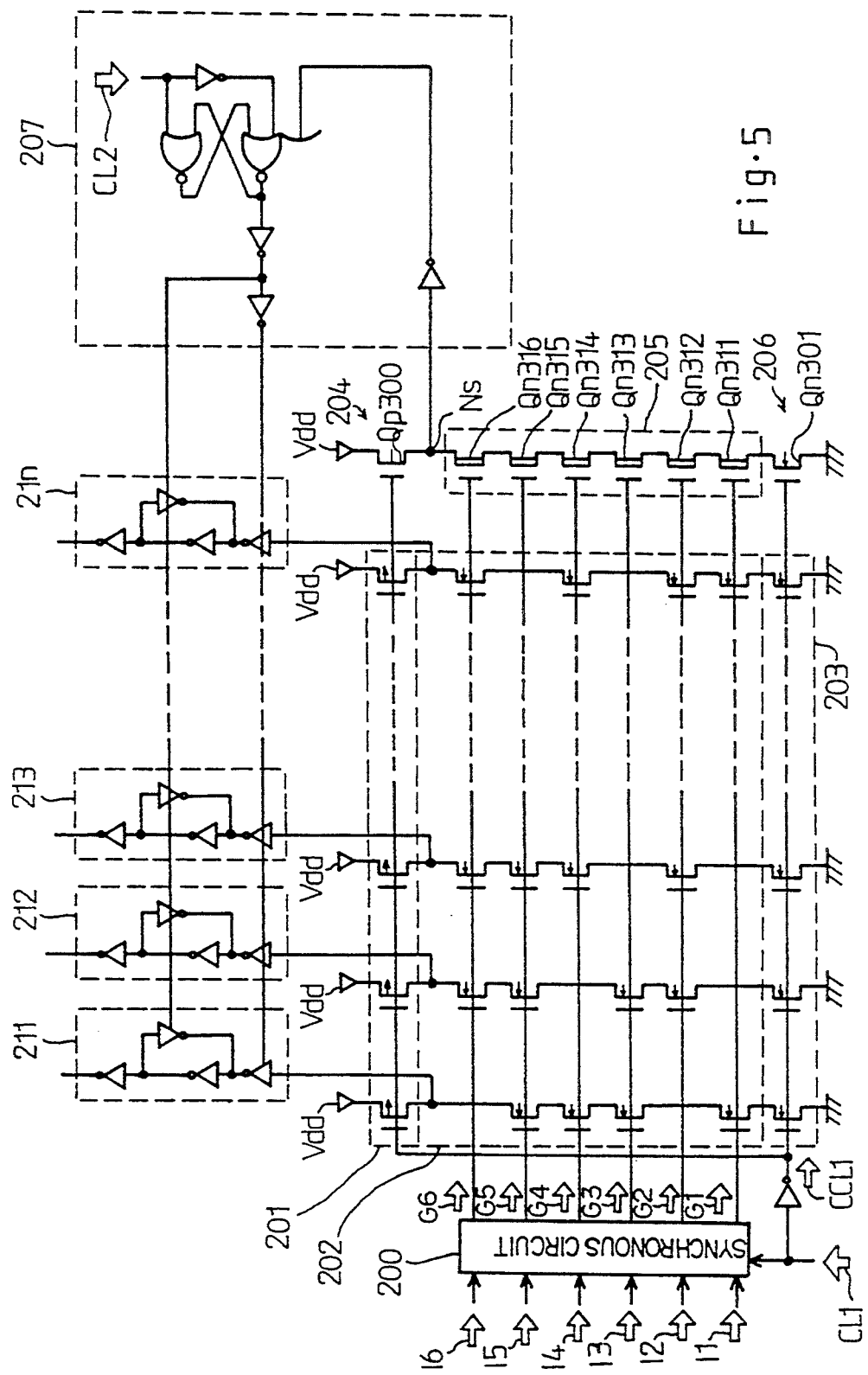
FIG. 5 is a circuit diagram showing the circuit arrangement of another dynamic decoder according to the present invention.

Description is hereinbelow made on the circuit behavior of the dynamic decoder with reference to FIG. 4 of the drawings on the assumption that the input signals I1 to I6 are logic "1" level, logic "0" level, logic "1" level, logic "1" level, logic "1" level and logic "0" level. Logic "1" level and logic "0" level are respectively equivalent to the high voltage level and the low voltage level in this instance.

Assuming now that the first clock signal CL1 rises to the high voltage level at time t11, the synchronous circuit 100 latches the input signals I1 to I6, and outputs the synchronized input signals G1 to G6. The synchronized input signals G1, G3, G4 and G5 of the high voltage level cause all of the n-channel enhancement type switching transistors Qn111, Qn113, Qn114 and Qn115 of the leftmost column to turn on. However, each of the other columns has at least one n-channel enhancement type switching transistor in off-state.

The inverter IV11 supplies the complementary clock signal CCL1 of the low voltage level to the main precharging circuit 101 and to the main discharging circuit 103. The p-channel enhancement type charging transistors Qp101 to Qp10$n$ turn on, and supply current to the associated columns of n-channel enhancement type switching transistors Qn111 to Qn1$n$6. However, the n-channel enhancement type discharging transistors Qn201 to Qn20$n$ are kept off, and the electric charges are accumulated in the drain nodes N11 to N1$n$ of the p-channel enhancement type charging transistors Qp101 to Qp10$n$. As a result, all of the decoded signals O1 to On are shifted to the high voltage levels.

On the other hand, the second clock signal CL2 is in the low voltage level at time t11, and the p-channel enhancement type charging transistor Qp210 turns on so that current is supplied to the timer circuit 105. Since the second clock signal CL2 of the low voltage level keeps the n-channel enhancement type discharging transistor Qn227 off, the electric charges are accumulated in the drain node Ns of the p-channel enhancement type charging transistor Qp210, and the timing signal Os rises to the high voltage level.

While the timing signal Os is in the high voltage level, the inverter IV12 keeps the reset signal SENSE at the indicative low voltage level, and the reset signal SENSE does not have any influence on the D-flip flop circuit 107$a$.

The first clock signal CL1 goes down to the low voltage level at time t12. The inverter 103 changes the complementary clock signal CCL1 to the high voltage level, and the p-channel enhancement type charging transistors Qp101 to Qp10$n$ turn off. However, the complementary clock signal CCL1 of the high voltage level allows the n-channel enhancement type discharging transistors Qn201 to Qn20$n$ to turn on.

As described hereinbefore, only the leftmost column is constituted by the n-channel enhancement type switching transistors in the on-state, and the electric charges in the drain node N11 are discharged to the ground voltage line. However, the other drain nodes N12 to N1$n$ keep the electric charges. For this reason, the decoded signal O1 is rapidly shifted to the low voltage level, and the other decoded signals O2 to On remain in the high voltage level.

The second clock signal CL2 reaches the high voltage level at time t13, and the NOR gate NR1 and the inverter IV15 cause the NOR gate NR2 to shift the output signal to logic "1" level. As a result, the inverter IV13 and the inverter IV14 shift the first enable signal EL1 to the low voltage level and the second enable signal EL2 to the high voltage level at time 14.

The first enable signal EL1 of the low voltage level disables the clocked inverters IV18, and the second enable signal EL2 of the high voltage level enables the clocked input inverters IV16. For this reason, the decoded signal O1 of logic 0" level and the decoded signals O2 to On of logic "1" level are inverted by the clocked input inverters IV16, and are stored in the respective memory loops. The output inverters IV19 produce an output signal D1 of logic "1" level and output signals D2 to Dn of logic "0" level from the twice inverted decoded signals O1 to On.

The second clock signal CL2 of the high voltage level causes the p-channel enhancement type charging transistor Qp210 to turn off. On the other hand, the second clock signal CL2 of the high voltage level allows the n-channel enhancement type discharging transistor Qn227 to turn on, and the electric charges are discharged from the drain node Ns to the ground voltage line. As a result, the timing Os starts to rise toward the low voltage level. If the timing Os becomes lower than the threshold of the inverter IV12 at time t15, the inverter IV12 changes the reset signal SENSE from logic "0" level to logic "1" level, and the D-flip flop circuit 107$a$ changes the output signal to logic "0" level at time t16.

With the output signal of logic "0" level, the inverters IV13 and IV14 shift the first enable signal EL1 and the second enable signal EL2 to the high voltage level and the low voltage level, and the clocked inverters IV18 and the clocked input inverters IV16 are enabled and disabled, respectively. This means that the latch circuits 111 to 11$n$ are electrically isolated from the drain nodes N11 to N1$n$, and the memory loops of the latch circuits 111 to 11$n$ stably store the decoded signals O1 to On.

If the first and second clock signals CL1 and CL2 are altering at a low frequency, the accumulated electric charges may leak out from the drain nodes N12 to N1$n$, and the voltage levels at the drain nodes N12 to N1$n$ may be decayed from time t17. Even if the voltage level at the drain nodes N12 to N1$n$ become lower than the threshold of the clocked input inverters IV16, the second enable signal EL2 of the inactive low voltage level does not allow the clocked input inverters IV16 to change the voltage levels at the output nodes thereof. For this reason, the latch circuits 111 to 11$n$ keeps the correct output signals D1 to Dn, and the dynamic decoder according to the present invention is free from malfunction due to the leakage current at the drain nodes N12 to N1$n$.

The timing for changing the reset signal SENSE to the active high voltage level is depending upon the current driving capability of the series of n-channel enhancement type load transistors Qn221 to Qn226. The current driving capability of the timer circuit 105 is regulated to a smaller value than that of each column of n-channel enhancement type switching transistors Qn111 to Qn115, Qn122 to Qn126, Qn132 to Qn136 or Qn1$n$1 to Qn1$n$6, and the reset signal SENSE is changed to the active level after entry of the decoded signals O1 to On into stable state.

The timer circuit 105 does not have any undesirable influence on the dynamic decoding operation at high frequency clocks. Namely, the high-frequency second clock signal CL2 may alter to the low voltage level before the drain node Ns reaches the low voltage level, and the p-channel enhancement type charging transistor Qp210 starts to precharge the drain node Ns. This means that the reset signal SENSE remains in the inactive low voltage level or logic "0" level at all times. However, the D-flip flop 107$a$ responds to the second clock signal CL2, and exactly controls the latch circuits 111 to 11$n$. Therefore, the timer circuit 105 does not have any undesirable influence on the controlling circuit 107 at a high frequency operation.

Additionally, the newly added auxiliary precharging circuit 104, the timer circuit 105 and the auxiliary discharging circuit 106 is formed by only one series combination of transistors, and occupies a negligible amount of real estate. In other words, the additional circuits 104, 105 and 106 does not affect the integration density of an integrated circuit device equipped with the dynamic decoder according to the present invention.

Second Embodiment

Turning to FIG. 3 of the drawings, another dynamic decoder embodying the present invention largely comprises a synchronous circuit 200, a main precharging circuit 201, a switching transistor array 202, a main discharging circuit 203, an auxiliary precharging circuit 204, a timer circuit 205, an auxiliary discharging circuit 206, a controlling circuit 207 and an array of latch circuits 211, 212, 213 and 21n. A first clock signal CL1 and a second clock signal CL2 are supplied to the dynamic decoder, and are identical with the first and second clock signals of the first embodiment.

The synchronous circuit 200, the main precharging circuit 201, the switching transistor array 202, the main discharging circuit 203, the controlling circuit 207 and the latch circuits 211 to 21n are similar in circuit arrangement to those of the first embodiment, and are not described in detail for avoiding repetition.

The auxiliary precharging circuit 204 is implemented by a p-channel enhancement type charging transistor Qp300 gated with the complementary clock signal CCL1, and the auxiliary discharging circuit 206 is implemented by an n-channel enhancement type discharging transistor Qn301 also gated with the complementary clock signal CCL1.

The complementary clock signal CCL1 is shifted between the high voltage level and the low voltage level as similar to the second clock signal CL2, and the p-channel enhancement type charging transistor Qp300 and the n-channel enhancement type discharging transistor Qn301 charge and discharge the drain node Ns.

The timer circuit 205 is implemented by a series combination of n-channel depletion type load transistors Qn311 to Qn316, and the synchronized input signals G1 to G6 are supplied to the gate electrodes of the n-channel depletion type load transistors Qn311 to Qn316. The n-channel depletion type load transistors Qn311 to Qn316 are turned on regardless of the voltage level of the synchronized input signals G1 to G6. In other words, the n-channel depletion type load transistors Qn311 to Qn316 are equivalent to the n-channel enhancement type load transistors Qn221 to Qn226 applied with the positive power voltage level Vdd.

The timer circuit 205 starts to precharge earlier than that of the timer circuit 105. However, the current driving capability of the timer circuit 205 is smaller than the timer circuit 105, and the dynamic decoder shown in FIG. 3 behaves as similar to the first embodiment.

The charging and discharging transistors Qp300 and Qn301 and the depletion type load transistors Qn311 to Qn316 are controlled by the complementary clock signal CCL1 and the synchronized input signals G1 to G6, and, accordingly, the circuit arrangement of the second embodiment is simpler than that of the first embodiment.

The circuit behavior and the advantages are similar to those of the first embodiment, and no further description is incorporated hereinbelow.

Although particular embodiments of the present invention have been shown and described, it will be obvious to those skilled in the art that various changes and modifications may be made without departing from the spirit and scope of the present invention. Various timer circuits are available for producing the timing signal Os, and the timer circuit 105 may be replaced with a combination of a capacitor and an inverter.

What is claimed is:

1. A dynamic decoder for decoding input signals, comprising:
   a) a main precharging circuit for charging a plurality of decoded signal nodes to a first level at a first timing;
   b) a main discharging circuit associated with said plurality of decoded signal nodes for discharging said plurality of decoded signal nodes at a second timing after said first timing;
   c) a plurality of switching transistors disposed at selected positions in a matrix, and grouped into a plurality of serial circuits coupled between said plurality of decoded signal nodes and said main discharging circuit;
   d) an input circuit operative to selectively supply said input signals to control nodes of said plurality of switching transistors between said first timing and said second timing for selectively discharging said plurality of decoded signal nodes through said main discharging circuit, a plurality of decoded signals being produced at said plurality of decoded signal nodes at a third timing after said second timing;
   e) a plurality of latch circuits respectively coupled with said plurality of decoded signal nodes, and enabled with an enable signal for latching said plurality of decoded signals, said enable signal being shifted to an inactive level at a fourth timing for electrically isolating said plurality of latch circuits from said plurality of decoded signal nodes;
   f) a timing producing means for producing a timing control signal after a predetermined lapse of time from said second timing; and
   g) a controlling circuit responsive to said timing control signal for shifting said enable signal to said inactive level at said fourth timing.

2. The dynamic decoder as set forth in claim 1, in which said timing producing means comprises
   an auxiliary precharging circuit for charging a timing signal node at a fifth timing between said first timing and said second timing,
   an auxiliary discharging circuit for discharging said timing signal node at a sixth timing between said second timing and said third timing, and
   a series combination of load transistors coupled between said timing signal node and said auxiliary discharging circuit, and smaller in current driving capability than each of said plurality of serial circuits, said timing signal being produced when said timing signal node is decayed to a predetermined level.

3. The dynamic decoder as set forth in claim 2, in which a first clock signal and a second clock signal are supplied to said dynamic decoder, and said first clock signal is almost complementary to said second clock signal with a leading edge slightly later than a trailing edge of said first clock signal.

4. The dynamic decoder as set forth in claim 3, in which said main precharging circuit comprises a first plurality of first enhancement type transistors, said auxiliary precharging circuit comprises a single first enhancement type transistor, said main discharging circuit comprises a second plurality of second enhancement type transistors, said auxiliary discharging circuit comprises a single second enhancement type transistor, said plurality of switching transistors comprise a third plurality of second enhancement type transistors, and said series combination of load transistors comprise a fourth plurality of second enhancement type transistors having respective gate electrodes coupled with a source of said first level, said first timing being defined by a trailing edge of a complementary clock signal of said first clock gate electrodes of said first plurality of first enhancement type transistors, said second timing being defined by a leading edge of said complementary clock signal supplied to gate electrodes of said second plurality of first enhancement type transistors, said fifth timing being defined by a trailing edge of said second clock signal supplied to a gate electrode of said single first enhancement type transistor, said sixth timing being defined by a leading edge of said second clock signal supplied to a gate electrode of said single second enhancement type transistor.

5. The dynamic decoder as set forth in claim 4, in which said controlling circuit comprises a D-flip flop circuit having an input node supplied with said second clock signal and a reset node supplied with a complementary signal of said timing control signal, and a series combination of inverters coupled with an output node of said D-flip flop circuit for producing a first sub-enable signal and a second sub-enable signal, said first and second sub-enable signals serving as said enable signal.

6. The dynamic decoder as set forth in claim 3, in which said main precharging circuit comprises a first plurality of first enhancement type transistors, said auxiliary precharging circuit comprises a single first enhancement type transistor, said main discharging circuit comprises a second plurality of second enhancement type transistors, said auxiliary discharging circuit comprises a single second enhancement type transistor, said plurality of switching transistors comprise a third plurality of second enhancement type transistors, and said series combination of lead transistors comprises depletion type switching transistors having respective gate electrodes supplied with said input signals, respectively, said first timing being defined by a trailing edge of a complementary clock signal of said first clock signal supplied to gate electrodes of said first plurality of first enhancement type transistors, said second timing being defined by a leading edge of said complementary clock signal supplied to gate electronics of said second plurality of first enhancement type transistors, said fifth timing being defined by said trailing edge of said complementary clock signal supplied to a gate electrode of said single first enhancement type transistor so that said fifth timing is matched with said first timing, said sixth timing being defined by said leading edge of said complementary clock signal supplied to a gate electrode of said single second enhancement type transistor so that said sixth timing is matched with said second timing.

7. The dynamic decoder as set forth in claim 6, in which said controlling circuit comprises a D-flip flop circuit having an input node supplied with said second clock signal and a reset node supplied with a complementary signal of said timing control signal, and a series combination of inverters coupled with an output node of said D-flip flop circuit for producing a first sub-enable signal and a second sub-enable signal, said first and second sub-enable signals serving as said enable signal.

* * * * *